United States Patent
Gasperi et al.

(10) Patent No.: US 7,177,132 B2
(45) Date of Patent: Feb. 13, 2007

(54) METHOD AND APPARATUS FOR DETERMINING A SWITCHING SIGNAL STATE

(75) Inventors: Michael Lee Gasperi, Racine, WI (US); David Dale Brandt, Milwaukee, WI (US); Thong T. Nguyen, Shorewood, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 483 days.

(21) Appl. No.: 10/663,046

(22) Filed: Sep. 15, 2003

(65) Prior Publication Data

US 2005/0073202 A1    Apr. 7, 2005

Related U.S. Application Data

(63) Continuation of application No. 10/369,055, filed on Mar. 25, 2003.

(51) Int. Cl.
*H01H 35/00*    (2006.01)
*H01H 36/00*    (2006.01)

(52) U.S. Cl. .................. 361/181; 178/18.02; 307/116; 307/125; 340/644; 361/179

(58) Field of Classification Search ............. 178/18.02; 361/181
See application file for complete search history.

(56) References Cited

U.S. PATENT DOCUMENTS 6,998,545 B2 *    2/2006    Harkcom et al. ........ 178/18.02

* cited by examiner

*Primary Examiner*—Brian Sircus
*Assistant Examiner*—Hal I. Kaplan
(74) *Attorney, Agent, or Firm*—Patrick S. Yoder; Alexander M. Gerasimow

(57) ABSTRACT

A technique for controlling a switching circuit includes one or more sensing circuits that generate signals based upon the presence of an actuating object and upon a randomly applied strobe signal. The generated signals are sampled and are used as a for determining the state of an output signal. The sensing circuit may generate the signals based upon capacitive coupling with the actuating object. The randomization of the sampling enhances immunity to periodic noise. Where more than one sensing circuit is included, the output of the circuits may be considered together for determining the state of the output signal, such as based upon predetermined ranges of signal levels. Signals of the sensing circuit may be sampled in the absence of the strobe to provide an indication of the relative noise level. If the noise level is determined to be elevated, the output signal may not change states.

26 Claims, 4 Drawing Sheets

METHOD AND APPARATUS FOR DETERMINING A SWITCHING SIGNAL STATE

CROSS-REFERENCE TO RELATED APPLICATIONS

This application is a Continuation of application Ser. No. 10/369,055, filed Mar. 25, 2003.

BACKGROUND OF THE INVENTION

The present invention relates generally to sensors for electronically sensing the presence of an object and generating a switching signal in response to the object, and in particular to such a sensor having improved noise immunity.

Many switching circuits and devices have been proposed and are currently in use. In certain switches, the presence of an object, such as the hand of an operator, a workpiece, and so forth, is sensed and serves as a basis for changing the conductive state of a switch. The presence or absence of an object may be detected by analyzing the interaction between the object and an electronic sensor. For example, the sensor may detect changes at a sensing surface, caused by an object touching the sensing surface. Sensing in such cases may be based upon changes in temperature, electrical resistance, radio-wave reception, electrical capacitance or inductance, and so forth. In electronic sensors, sampling is commonly used to detect signals that can be processed to determine whether the monitored parameter has changed, and that an output signal is warranted. Electrical noise from the environment, however, may interfere with the sensor's sampling of data and may result in faulty operation of the sensor.

In certain sensor designs, the presence or absence of an object may be detected by measuring the interaction of the object with an electromagnetic field generated near the sensing surface. The object, when near or touching the sensing surface, introduces a new or changed impedance into the circuit generating the electromagnetic field through capacitive or inductive coupling. In a capacitive presence sensor, for example, an object may increase a capacitive coupling between an electrode of the generating circuit and environmental ground return paths. In an inductive presence sensor, the object may inductively couple to an antenna of the generating circuit to change the effective inductance of the antenna.

This change in impedance, caused by the introduction of an object near or touching the sensing surface, is manifested as an energy transfer from the generating circuit to the object, such energy transfer being detected by a sensing circuit, for example, as increased current flow. The amount of energy transfer may be compared against a threshold to produce a binary, switched output indicating the presence or absence of an object. In certain applications, it may be desirable for the sensor to be a proximity device, or in other words, to only require the sensed object enter a sensing volume. In other applications, it may be desirable for the sensor to be touch-sensitive, or in other words, to require the sensed object touch the sensing surface encompassing the electrode of the generating circuit.

Electromagnetic field presence sensors may be used in a wide variety of consumer and commercial applications. For example, touch-sensitive lamps found in homes employ a capacitive presence sensor. Electromagnetic field presence sensors are particularly useful in hostile industrial environments because the sensors do not require physical or electrical (ohmic) contact with the object, and can be easily sealed against water and dirt. Moreover, these sensors are particularly useful in industrial automation and control systems. For example, in an industrial context a human hand placed in the sensing volume or on the sensing surface can actuate functions of machinery. The use of inductive and capacitive presence sensors to control machinery reduces human operator fatigue associated with repetitive control switch actuation (i.e., as with traditional electromechanical push buttons). Over the past several years it has become increasingly evident that repeated actuation of electromechanical switching devices, such as in assembly lines, production machinery, and the like, can lead to operator fatigue.

While the devices greatly reduce fatigue by relieving the operator of the need to depress or move a mechanical actuator, presence sensing devices have been prone to false actuation by sources other than the object of interest (e.g. an operator's hand). Particularly problematical sources of actuation include moisture, machinery fluids, various articles, tools, and so forth. Additionally, electrical noise from the environment or conducted through power or even data lines may cause false triggering of the sensor, particularly when sampling techniques are used as a basis for determining the presence of an actuating object.

A particular difficulty in sampled data sensing systems is the presence of periodic or cyclic noise. The detection circuitry typically determines whether a detected signal has persisted for a preset duration or number of sample periods, and such periodic noise, if corresponding to the period of sampling, can produce data appearing to indicate the presence of an actuating object in error. Averaging circuitry may be added to the sensing circuitry so as to diminish the effect of noise in such cases. Such averaging circuitry, however, has drawbacks, such as slowing the response of the presence sensor to changes in the presence or absence of an object it is detecting, thus limiting the application of such switches in cases where fast response is required.

There is a need, therefore, to improve the reaction time of electromagnetic field presence sensors, to reduce the potential for false actuation of these sensors, and more particularly, for these sensors to reliably differentiate between bare or gloved hands and foreign objects. A particular need exists for these sensors and switches that exhibit reduced noise sensitivity, particularly to periodic or cyclic noise. Furthermore, there is a need for such sensors and switches capable of self-calibrating and detecting when conditions are outside normal operating ranges.

SUMMARY OF THE INVENTION

The present invention provides a novel technique and apparatus, with improved noise immunity, for reliably detecting the presence or absence of an object, such as for switching purposes, designed to respond to such needs. The technique makes use of varying or random sample periods to overcome sensitivity to periodic or cyclic noise. The technique thus results in reduced sensitivity to noise patterns that can correspond with sample intervals between sample acquisition times. Moreover, the technique offers novel tools for analyzing sampled data from a sensor that can serve as the basis for identifying the presence or absence of an actuating object, potential fault or malfunction of the device, or a level of noise judged too elevated to permit reliable signal output or switching.

In accordance with one aspect of the present technique, a method is provided for controlling a switching circuit. In accordance with the method, signals are measured from a sensor in response to an actuating object. The measured signals are randomly sampled. The state of an output signal is then changed based upon the randomly sampled measured signals. The measurement may include converting the sampled signals to digital values, and the digital values may be accumulated and compared to a threshold value to determine the appropriate state of the output signal. The measured signals may be in response to a strobe signal, with the strobe signal being applied at random intervals to render a greater immunity to cyclic or periodic noise.

In accordance with another aspect of the technique, a system is provided for controlling a switching circuit that includes generating signals from a plurality of sensors in response to an actuating object and a strobe signal applied to the sensors at random intervals. The generating signals are then sampled. The state of an output signal is changed based upon the sample signals from the plurality of sensors. A noise-responsive measurement may be taken as well to determine a relative noise level based upon the noise-responsive signals.

The invention also provides a system for controlling a switching circuit. The system may include one or more sensors which are sampled at random intervals to determine the appropriate state of an output signal. The sensors may be capacitive sensors or another type of sensor, such as an inductive sensor. The switching system may be used to control any suitable type of switch, such as a relay via an actuating coil.

BRIEF DESCRIPTION OF THE DRAWINGS

The foregoing and other advantages and features of the invention will become apparent upon reading the following detailed description and upon reference to the drawings in which.

DETAILED DESCRIPTION OF SPECIFIC EMBODIMENTS

The present inventors have recognized that electrical noise may be periodic and thus may cause the noise reduction by averaging method to fail. For example, a noise signal may be a sine wave and the phase of it can line up with sample acquisition times of the presence sensor device. Previous attempts to resolve this problem, such as use of frequency domain analysis of the noise, required excessive processor memory and slowed sensor response time. The present invention overcomes the problem of periodic noise coinciding with periodic sample times by deliberately randomizing the sample times. This forces the noise to look like random noise even if it starts out periodic because the periodic noise randomly adds to the individual sample values. Over time the noise should have a zero mean value, and because of the sample-time randomization, the noise is averaged out relatively faster. Sensor reaction time is improved because lower numbers of samples are required for the averaging method to converge.

Figure 1:
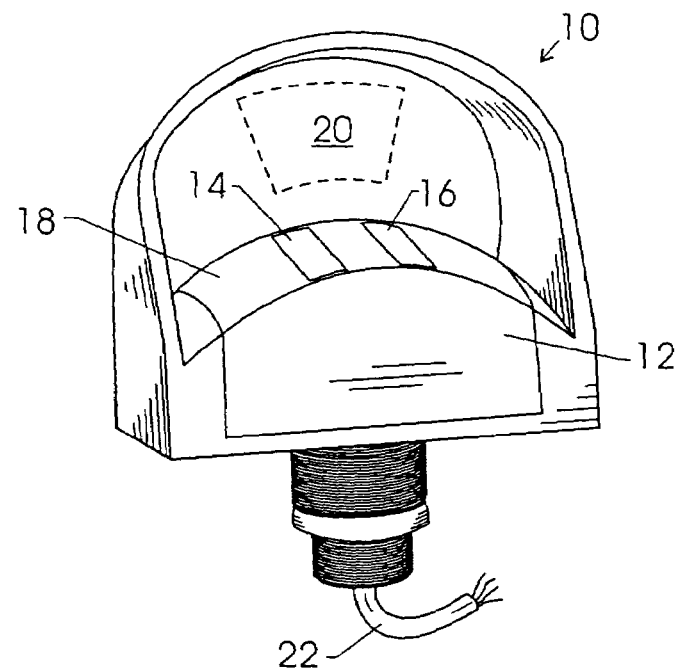
FIG. 1 is a perspective view of one embodiment of a presence sensor, such as for activating a switch, including a housing that holds a sensing circuit, a sensing surface covering an electrode or inductor, and an output cable that conducts a signal indicating the presence of an object in a sensing volume or touching the sensing surface.

Turning now to the drawings, and referring first to FIG. 1, a presence sensor, such as for generating an output signal and causing a change in state of a switch, is illustrated and designated generally by the reference numeral 10. The presence sensor 10 may take many forms, and include devices for accomplishing many different and varied purposes. In a currently preferred implementation, presence sensor 10 includes a housing 12 supporting on one face, a first electrode pad 14 and a second electrode pad 16, both pads electrically insulated from the environment by a cover over a sensing surface 18. The sensor detects the presence of an object 20 as the object 20 approaches or touches the sensing surface 18. Cabling 22 may exit the presence sensor 10 for conducting power to internal sensing circuitry (not shown) and for providing at least one output signal indicating the presence or absence of an object touching or proximate to the sensing surface 18.

Various types and forms of output signals may be generated by the sensor. For example, simple varying voltage or current waveforms may be produced, indicative of the influence of an actuating object on the sensor, such as by coupling. The output may alternatively be a binary presence signal, or a variety of both binary and analog type presence outputs. The output may be an analog output indicating, for example, a distance to a remote object as deduced by the amount of energy transfer. Similarly, the output may take the form of a simple digital signal or may be a more complex network compatible message for communication on standard industrial networks. In the illustrative embodiment of FIG. 1 and as described in greater detail below, two electrode pads 14 and 16 may be included, such as in the form of individual metallic or conductive elements, that provide redundant or complementary output signals indicative of more than one field interaction effect with an actuating object, both effects serving as a basis for evaluating the noise level of the system and the appropriate state of the output signal produced.

Figure 2:
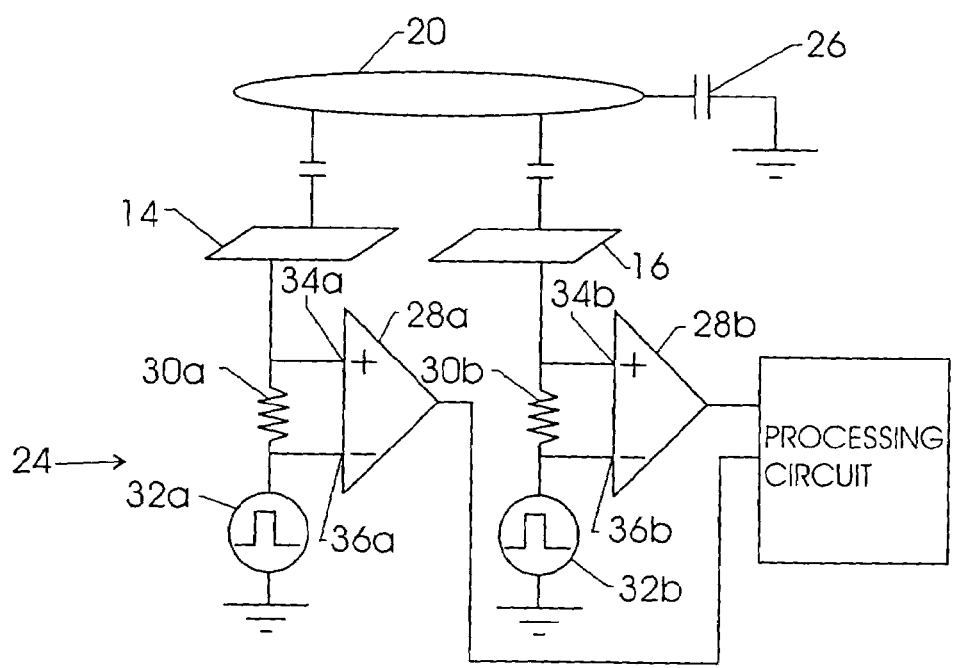
FIG. 2 is a schematic representation of exemplary sensing circuits for a capacitive presence sensor with redundant electrode pads, and showing the effect of an object in the sensing volume or touching the sensing surface.

Referring now to FIG. 2, signal generating and sensing circuits 24 are schematically illustrated. The signal generating circuit may include one or more electrode pads (two such pads 14 and 16 being provided in the illustrated embodiment), and one or more strobe circuits 32*a* and 32*b* (pulse generators) used to excite the electrode pads 14 and 16 with an input signal, such as a voltage signal. The housing 12 (FIG. 1) holds a sensing circuit that may include one or more operational amplifiers 28*a* and 28*b*, or similarly operating devices, and one or more resistors 30a and 30b. The amplifiers 28a and 28b serve to measure the change in voltage (and thus current flow) across resistors 30a and 30b. Amplifiers 28a and 28b compare the resistor terminal voltages at points 34a and 36a, and points 34b and 36b. A processing circuit is then used to analyze the measured current. It is noted that other sensing systems can be easily substituted, including other current sensing devices or voltage sensors, and the actuating signals detected may result from various physical or electrical phenomena, such as changes in capacitive or inductive coupling.

During operation, an object 20, such as a human hand, may touch or approach the sensing surface 18 (FIG. 1), thereby establishing a capacitive coupling with the electrode pads 14 and 16. This capacitive coupling provides a path of energy transfer from the electrode pads 14 and 16 into the object 20 and through a capacitive coupling, represented generally at reference numeral 26, between the object and the environment (e.g. earth). A completed circuit between the sensing circuitry and the object is thereby provided by capacitive coupling between the sensing circuitry and earth. The capacitive coupling between the object and earth, and between the sensing circuitry and earth results from the normal proximity and connection of the object and sensing circuitry to their environments.

In general, the object 20, when near or touching the sensing surface 18 (FIG. 1) introduces a changed impedance into the generating circuit through capacitive or inductive coupling. The introduction of the object may, for example, cause additional current flow from the strobe circuits 32a and 32b through the electrode pads 14 and 16 to the object 20 and then to earth, insofar as current flow is proportional to changes in voltage and impedance (such as capacitance and inductance) of the generating circuit. In a capacitive presence sensor, for example, the object may increase a capacitive coupling between an electrode of the generating circuit and environmental ground return paths. In an inductive presence sensor, the object may inductively couple to an antenna of the generating circuit to change the effective inductance of that antenna. Thus, in sum, this change in impedance, caused by the introduction of an object 20, is manifest as an energy transfer from the generating circuit to the object, such energy transfer being detected by a sensing circuit, for example, as increased current flow.

In one embodiment, measurements to detect the presence or absence of an object near or touching the sensing surface 18 (FIG. 1) are made by exciting pads 14 and 16 with a voltage via strobe circuits 32a and 32b, and then measuring the resulting current flow into the pads 14 and 16 across resistors 30a and 30b. The changes in the current flowing through the resistors 30a and 30b are proportional to capacitance changes of the generating circuit caused by the presence or absence of the object 20. The terminal voltage values at points 34a, 34b, 36a and 36b of the resistors 30a and 30b indicate current flowing through the excited electrode pad to the object 20.

As will be appreciated by those skilled in the art, noise may be introduced from a variety of sources such as the environment, for example, by capacitive or inductive coupling with leads or points in the circuitry, or conducted through the power line provided to the sensing circuitry. The presence of noise may cause perturbations in voltage levels, additional current flow through the electrode pads 14 and 16, and ultimately cause unwanted false actuation or non-actuation of the presence sensor 10 and associated switches. The present technique addresses many such situations, particularly those in which the noise source may be periodic or cyclic in nature, and have a period which coincides with (i.e. is a multiple or factor of) the timing of the strobe circuits 32a and 32b used to excite the pads 14 and 16 with a voltage for sampling (to detect the presence or absence of an object near or touching sensing surface 18). Thus, the noise may become a component of the sample current readings and may falsely indicate that an object is touching or near the sensing surface 18 when such is not the case, or vice versa. Accordingly, as described below, the strobe input timing is randomized, so that the sensing circuitry may efficiently account for or avoid the effects of such noise.

Figure 3:
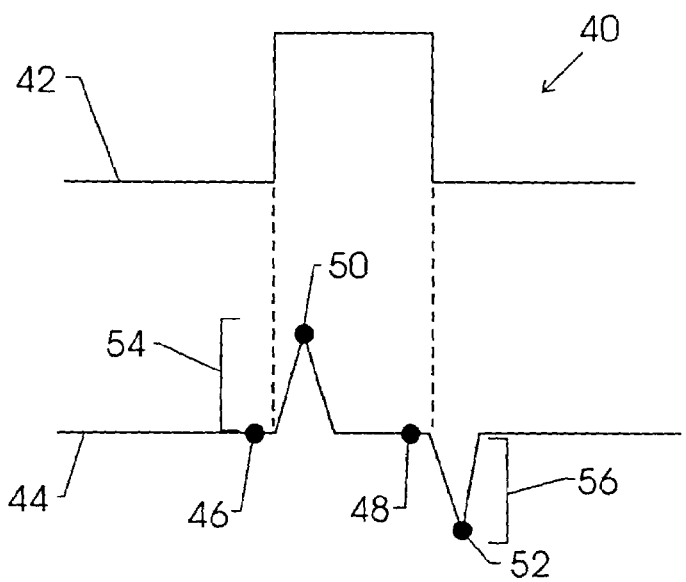
FIG. 3 is a graphical representation of the strobe and response waveforms with noted sample acquisition times.

Referring now to FIG. 3, the strobe and response waveforms 40 are illustrated. In particular, the strobe input pulse 42 and current response 44 versus time are represented, and sample acquisition times at four points (reference point 46, on peak point 50, reference point 48 and off peak point 52) are noted. The peak of this current response is considered directly proportional to capacitance of the generating circuit. In one embodiment, four analog-to-digital converters are used to measure the response to the strobe input. FIG. 3 shows the sequence (time) locations of the four measurements at reference point 46, on peak point 50, reference point 48 and off peak point 52. The difference in current between the on peak measurement point 50 and reference point 46 is designated as the on sample value 54, while the difference in current between the off peak measurement point 52 and reference point 48 is designated as the off sample value 56. In normal operation, the magnitude of the current at the on peak 50 will be higher for higher degrees of capacitance coupling. Points 46 and 48 are measured just before the leading and trailing edges, respectively, of the strobe input pulse 42, and are used as noise-indicating values, as described below. To render the system more immune to electrical noise, the differences between consecutive on sample values 54 and off sample values 56 are accumulated for a large number of strobe input pulses. In a present embodiment, a value is thus computed, called "Accumulate Differences" and the resulting value is in a variable named accDif, which is a measure of the sum of the noise plus the current response to the presence and absence of an object near or touching the sensing surface 18 (FIG. 1). As will be appreciated by those skilled in the art, actual measurements and signal processing are based upon digitized values for the measurements at points 46, 48, 50 and 52 over an available dynamic range, such as 0–255.

The "pad-to-earth" accDif value is proportional to the capacitance from either of the pads 14 and 16 (FIGS. 1 and 2) to earth. In one embodiment, typically 1,000 samples are accumulated resulting in values that can be as large as 150,000 when the sensing surface 18 is touched by a bare hand. Gloved hands may have values as low as 20,000. In the illustrated embodiment, the use of the redundant second electrode pad 16 (FIGS. 1 and 2) improves the reliability of the pad-to-earth readings. Additionally, the capacitance between pads provides useful information. Thus, "pad-to-pad" accDif values are computed by applying the strobe inputs to one pad while measuring the response on the other pad. The resulting values are proportional to the capacitance from one pad to the other. The resulting values are typically substantially smaller in magnitude, with typically some 6,000 samples being accumulated to improve accuracy in the presence of noise and to provide a scale comparable to the values obtained in the pad-to-earth readings.

Figure 4:
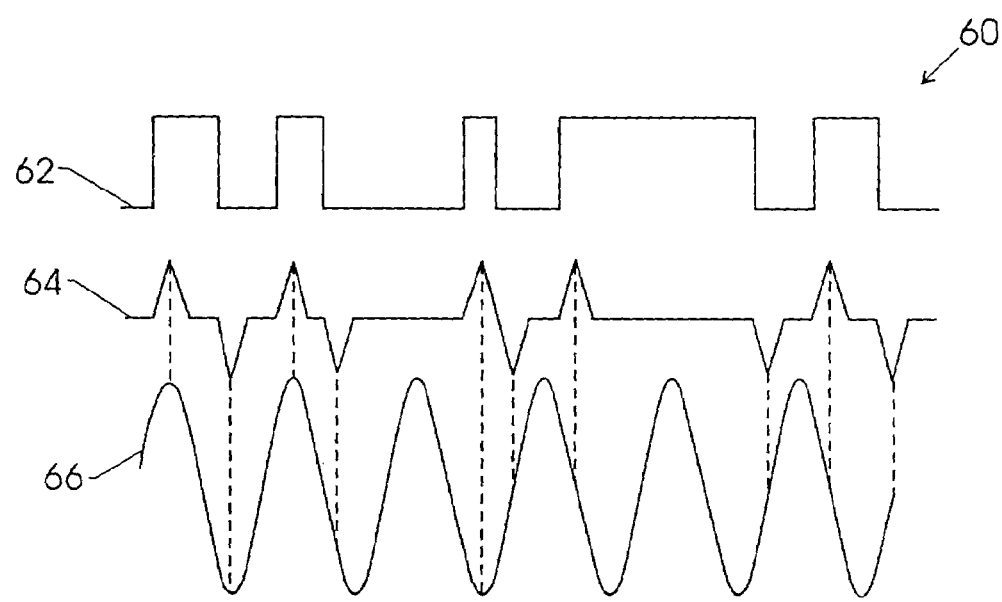
FIG. 4 is a graphical representation of the presence sensor waveforms which may include randomized strobe pulses, current response, and periodic or cyclic noise.

Referring now to FIG. 4, the presence sensor waveforms 60 may be illustrated as including strobe pulses 62, current response 64, and periodic or cyclic noise 66. Without randomization of the sampling stimulus (strobe pulses 62), periodic or cyclic noise, such as an AC noise signal 66, may get superimposed on the relatively small strobe response signal (current response 64), resulting in output values reflective of noise rather than true actuation. Accordingly, in the present technique, as illustrated in FIG. 4, the time between samples (strobe pulses 62) is deliberately randomized The noise experienced by the system, then, effectively appears to the sampling circuit as random noise, and is effectively averaged over a plurality of strobe and measurement samples. That is, the noise randomly adds to or subtracts from the individual sample values. Over time, the noise has a zero mean value, and by acquiring many samples, the noise is effectively averaged out of the accumulated signal to a high statistical degree of certainty. A plurality of sample signals may be obtained as described in the discussion of FIG. 3 above. Increasing the number of samples reduces the variance of the noise mean value. In actual implementation, the sensor and system design, then balances between the number of samples desired to provide noise immunity, and the amount of time available to acquire them.

It is noted that there are a variety of ways to efficiently generate the random delay or interval desired for the present data acquisition process. The currently preferred method employs the lower bits of a number that is changing over time to generate the delay, such as the accDif value discussed above. Other methods include, but are not limited to, storing random numbers in a table and proceeding through the table in order producing a string of pseudo random numbers, or using a random number generator.

For the two-pad sensor illustrated, it has been observed that the placement of a human hand near or touching the sensing surface 18 covering the electrode pads 14 and 16 creates high pad-to-earth readings but low pad-to-pad readings. Foreign objects like metal rings or wet cloth, and so forth, create low pad-to-earth readings and much higher pad-to-pad values. Experiments were performed to classify operators with gloves and foreign objects that might touch the sensing surface 18.

Figure 5:
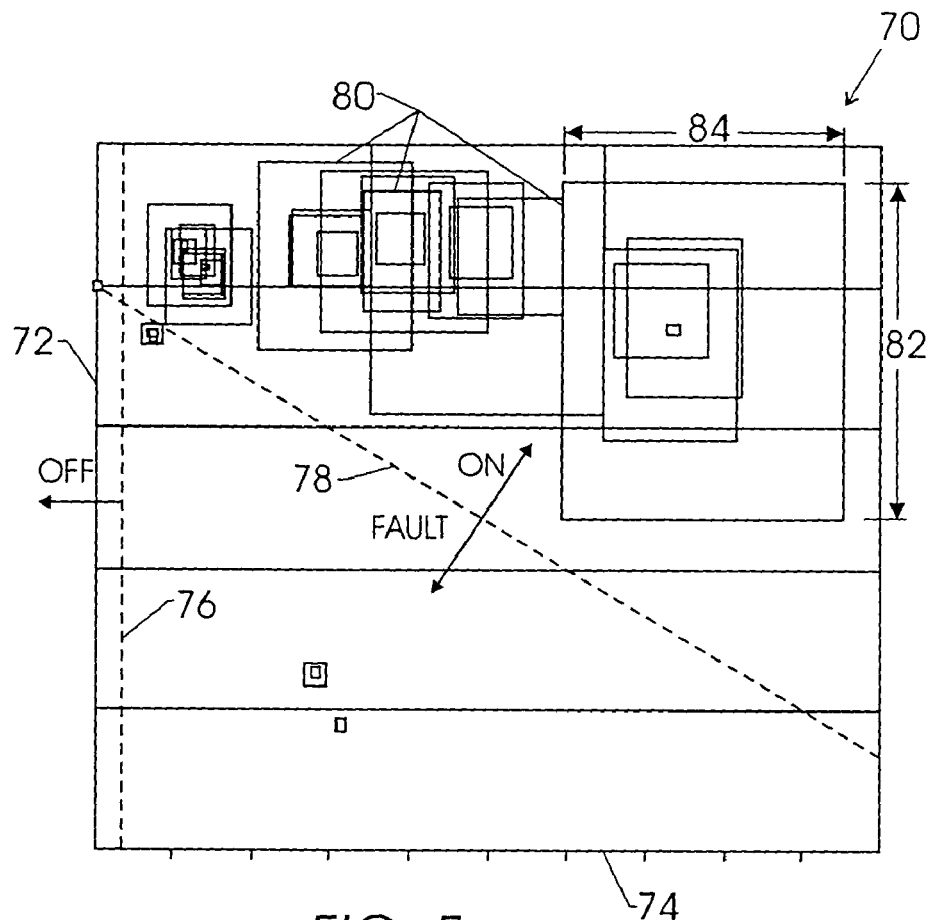
FIG. 5 is a graphical representation of an exemplary decision plane indicating noise immunity and is defined by experimental pad-to-earth readings and pad-to-pad readings from a sensing arrangement of the type shown in FIG. 2.

Referring now to FIG. 5, a representation of experimental readings for pad-to-earth (PE) and pad-to-pad (PP) are used to define a representation of a decision plane 70 with PP values 72 versus PE values 74, and is indicative of desired signal output (i.e. switching) scenarios and noise immunity. Each box 80 in FIG. 5 represents a different frequency and amplitude experiment or scenario, with the largest boxes for 20V noise at about 500 kHz frequency. Typically, the boxes 80 are drawn to indicate plus or minus three standard deviations in the estimate of the mean. Such conditions provide approximately 99.7% confidence that the true mean is within the area defined by the respective box. The size of the boxes 80, dimensions 82 and 84, thus are linked to sample size and statistical certainty.

Readings to the left of the vertical dotted line ("off line") 76 indicate no object touching or proximate to the sensing surface 18 (FIGS. 1 and 2). Readings above the diagonal dotted line ("fault line") 78 indicate that an actuating object, such as a human hand (bare or gloved) in the present example, is touching or proximate to the sensing surface 18. Finally, readings below fault line 78 may indicate that a foreign object is touching the sensing surface 18, and sampled values should be considered as resulting from a possible fault condition, as discussed below with reference to FIG. 6.

The presence of noise may affect the operation of presence sensor 10 in a variety of ways. For example, the presence sensor 10 may be appropriately actuated (i.e. produce an output signal or interrupt an output signal) in reaction to being touched, only to turn off later due to electrical noise. Conversely, the output signal could result when no actuating object is present in a different fault mode. Thus, as previously stated, it is desired to account for noise, particularly periodic or cyclic noise, and to render the system as immune to such noise as possible. As noted above, the random sampling provided by the strobe input signals provides a high degree of immunity from periodic or cyclic noise. Moreover, measurements made at points 46 and 48, as illustrated in FIG. 3 are used in a present embodiment, to provide a measure of the background noise.

In the absence of any noise, the value of measurements taken at points 46 and 48 would be near the middle of the dynamic range. However, noise causes them to vary from the midpoint. The total of the many readings of the absolute difference between measurements taken at points 46 and 48 and the actual value of the dynamic range midpoint is, in a present embodiment, called "Accumulated Absolute" (accAbs). A threshold of the accAbs value, then, may be used to provide a relative indication of the degree of noise experienced by the system. While a set threshold may be employed, such thresholds may not provide the desired degree of confidence due to changes in the amplitude and frequency of the noise and the coupling capacitance. Thus in a present implementation, a ratio threshold value is employed, such as the ratio of the accAbs to the pad-to-earth accDif (PE). Because noise primarily couples through the same capacitance that serves as the basis for pad-to-earth measurements, the ratio of the accAbs and the pad-to-earth accDif (PE) tends to cancel the capacitance effect. The actual threshold employed for this noise characterization may vary, depending upon the system design, and taking into account any unknown capacitance effects.

The amount of stray capacitance in the environment surrounding presence sensor 10 (FIGS. 1 and 2) may vary with installation conditions, which tend to cause significant offsets in the measurements taken to detect the presence of the actuating object. On power-up the presence sensor 10 may read the electrode pads 14 and 16 with the assumption no object is touching the sensing surface 18. Thereafter, these "nominal" values may be simply subtracted from the current readings to calculate the true pad-to-earth and pad-to-pad values.

The center of the dynamic range for comparison to measurements made at points 46 and 48 (FIG. 3) also may be determined at power-up. For more accuracy, the quantity of samples may be increased, for example, to ten times more than the number used for regular readings. It is noted that the program code for initialization is straightforward for those skilled in the art, and thus is not discussed in detail herein.

Figure 6:
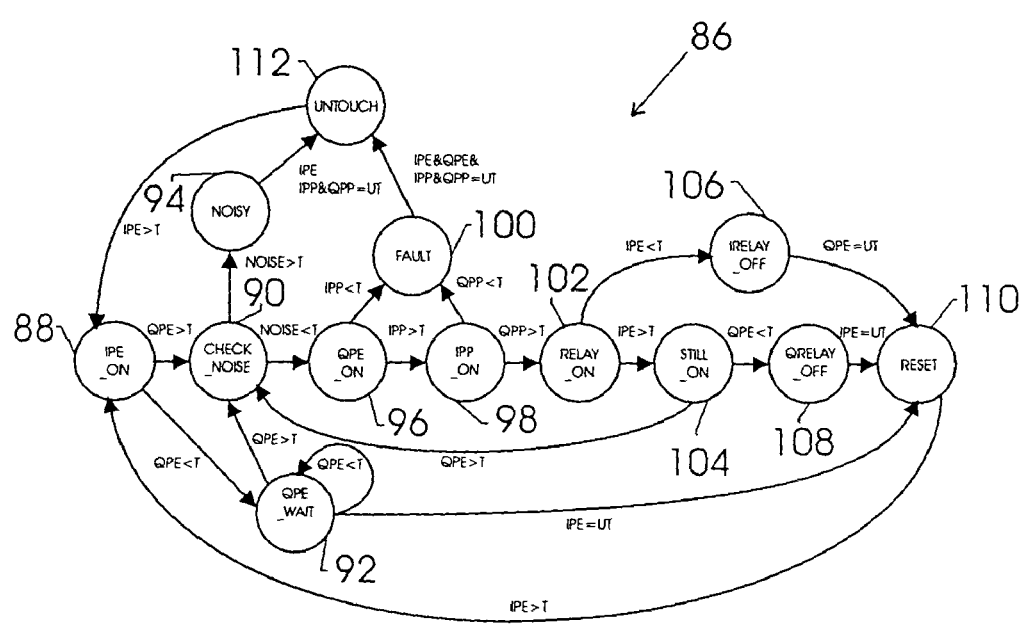
FIG. 6 is a flow diagram of an exemplary presence sensor state machine showing operational states and transitions between the states as may serve as the basis for evaluating sampled data via the system set forth in the previous Figures, for producing an output signal, such as for changing the state of a switch.

In one embodiment, the presence sensor 10 performs certain logical steps based upon sampled data values to determine whether the system noise is such that reliable actuation is possible, and whether sampled signals correspond to scenarios defined for changes of state (i.e. switching on or off output signals). Referring now to FIG. 6, the presence sensor 10 state diagram 86 shows various logical states and transition logic for movement between the states.

While several predetermined threshold values are employed by the logic, as mentioned above, for simplicity the nomenclature of FIG. 6 refers simply to a threshold symbol T, which may be understood in context by the values to which it is compared. The untouched condition requires that the pad-to-pad readings and pad-to-earth readings are within predetermined ranges, and is referred to by the symbol UT. In general, such thresholds for the "PP" and "PE" values may correspond to the switching scenarios summarized in FIG. 5. It is noted that in the nomenclature of FIG. 6, "I" refers to the first electrode pad 14, "Q" refers to the second electrode pad 16 (FIGS. 1 and 2), "PP" refers to pad-to-pad values, and "PE" refers to pad-to-earth values. It is also noted, for clarity, that the example discussed above, of a human hand near or touching the sensing surface 18 over the electrode pads 14 and 16, will be referred to in the discussion of FIG. 6 as the touched position. Clearly, however, any suitable triggering or actuating event may be understood by this language.

Normal operation of the presence sensor 10 (FIGS. 1 and 2) flows horizontally from left to right through the states summarized in FIG. 6. When the presence sensor 10 is turned on, and after successful initialization, the untouched position is assumed and is represented by the UNTOUCH state 112. Then, if the pad-to-earth (PE) reading on the first pad 14 (I) exceeds a predetermined threshold value (i.e., indicating that the sensing surface 18 may be touched by the operator), the operation will move to IPE_ON state 88.

If the pad-to-earth reading on the second pad 16 (QPE) exceeds a predetermined threshold, the operation will move immediately to the CHECK_NOISE state 90. Otherwise, if the pad-to-earth reading on the second pad 16 does not exceed the predetermine threshold, then the operation moves to the QPE_WAIT state 92, where the machine will iteratively loop back to check whether QPE exceeds the threshold, and then move to the CHECK_NOISE state 90 when QPE becomes greater than the threshold.

The QPE_WAIT state 92 is provided for situations in which, although the IPE reading has exceeded its threshold, the QPE reading has not yet exceeded its threshold. During the resulting waiting period, however, if the IPE falls within the predetermined UT (untouched condition) range of values, the operation reverts to the RESET state 110. If the IPE then exceeds a predetermined threshold value, the operation will start over at IPE_ON state 88 (the only path exiting the RESET state 110).

The operation will move from the CHECK_NOISE state 90 to a NOISY state 94 if the noise readings exceed a predetermined threshold, and ultimately move to the original UNTOUCH state 112 if the IPE, QPE, and the two accumulated pad-to-pad readings all fall within the UT ranges. The two accumulated pad-to-pad readings are represented by IPP (excite the second pad 16 "Q" and read capacitance of the first pad 14 "I") and by QPP (excite the first pad 14 "I" and read capacitance of the second pad 16 "Q"). In the present implementation, the circuitry successively excites (i.e. applies the strobe input) to one pad and then to the other to make the desired measurements, with the baseline measurements made at points 46 and 48 being made before and after each input pulse.

If, at the CHECK_NOISE state 90, the noise readings are lower than a predetermined threshold, the operation will move to the QPE_ON state 96. From this point, the operation may progress to the IPP_ON state 98 if the IPP value exceeds a predetermined threshold, and then on to the RELAY_ON state 102 if the QPP value exceeds a predetermined threshold. It is noted that if the IPP or QPP values do not exceed their respective threshold values, the operation will move to the FAULT state 100 (indicating, for example, that the sensed object 20 as illustrated in FIGS. 1 and 2 may be a foreign object and not the anticipated actuating object, e.g. a human hand), and then possibly move from the FAULT state 100 to the original UNTOUCH state 112 as discussed above.

At the RELAY_ON state 102, the IPE is once again evaluated. If the IPE exceeds a predetermined threshold, the operation goes to the STILL_ON state 104 (the operation assumes the sensing surface 18 is still touched by a human hand). If the IPE does not exceed the threshold, the operation moves to the IRELAY_OFF state 106, and is ultimately sent to the RESET state 110 (discussed above) if QPE falls within its "untouched" range. From the STILL_ON state 104, if the QPE exceeds its threshold, the operation assumes the touched position is maintained, but will return to the CHECK_NOISE state 90 to check for noise and to restart the process. If the QPE does not exceed its threshold, then as with the IPE evaluation, the operation moves to the parallel QRELAY_OFF state 108 and then to the RESET 110 state if the IPE values fall within the untouched range.

In one embodiment, the presence sensor 10 reads the capacitance by measuring current flow to the electrode pads 14 and 16 (FIGS. 1 and 2) while providing the strobed input or excitation signal. As discussed above, the signals are preferably provided for sampling at random intervals to afford immunity to periodic or cyclic noise. The timing of this measurement is determined, for example, by the execution of assembly programming code within a digital signal processor (DSP) of a type well known in the art. In one implementation, the low level code for data acquisition is broken up into two routines: StrobeOnRead and StrobeOffRead. The execution timing is maintained fixed despite any changes in the code due to the fact that the code is neither interrupt driven nor polled.

Figure 7:
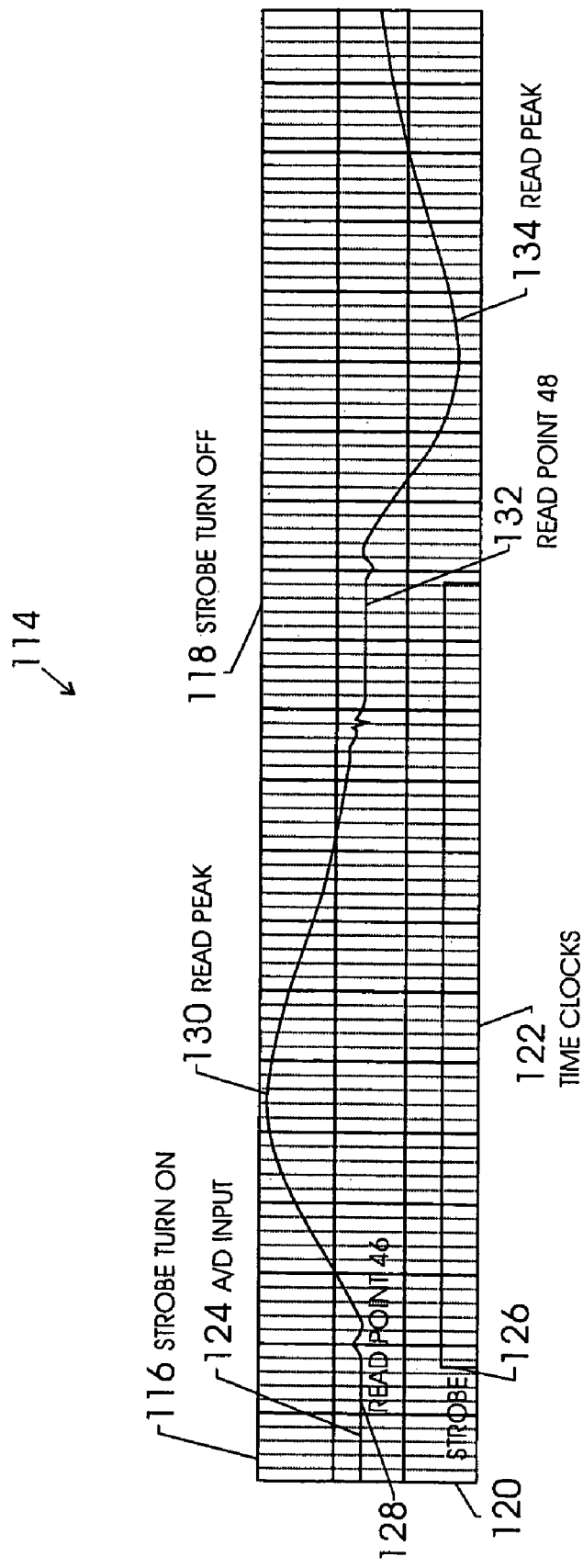
FIG. 7 is a typical analog voltage response (voltage versus time) to the strobe signals in the implementation of the previous Figures.

Referring now to FIG. 7, a typical analog voltage response 114 to the strobe turn on 116 and the subsequent strobe turn off 118 is shown. The strobe 126 voltage applied to electrode pads 14 and 16 (FIGS. 1 and 2) has been scaled to fit on the same scale as the A/D converter input 124. In this representation, the voltage scale 120 is linear, begins at 1.25 V, and ends at 2.00 V. The time clocks scale 122 is also linear.

For the strobe turn on 116, two reading are taken. One just prior to any change caused by the strobe 126, for example, at point 128 (read point 46 as illustrated in FIG. 3), and another close to the peak of the response, for example, at point 130. The DSP assembly code for the StrobeOnRead follows. First the A/D converter is set to acquire the pre-strobe value at point 128. While the sample is being converted, it calculates the absolute difference between point 128 and a previously measured bias for the "Accumulate Absolute" function. Finally the peak value at point 130 is read, and the new "on" sample is computed.

For the strobe turn off 118, two readings also are taken. One measurement is taken just prior to any change caused by the strobe 122, for example, at point 132 (read point 48 as illustrated in FIG. 3), and another close to the peak of the response at point 134. The DSP assembly code for the StrobeOffRead follows. First, the A/D converter is set to acquire the prestrobe value at point 132. While the sample is being converted, the difference is calculated between the measurement at point 132 and a previously measured bias for the "Accumulate Absolute" function. Finally, the peak value at point 132 is read, and the new "off" sample is computed.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method for determining the state of a switching system comprising:
   receiving a plurality of input signal values from a respective plurality of sensors activated by an object;
   comparing the input signal values to at least one region of signal values corresponding to anticipated values of the input signals derived from anticipated variations of the input signals based at least upon a type of object activating the sensors or anticipated noise at the sensors, wherein the input signal values are redundantly compared to the anticipated values to verify that all input signal values considered correspond to an ON state prior to determining that the system should be placed into an ON state; and
   determining a state of the switching system based upon the comparison, wherein the state is determined from one of a plurality of possible states, including an ON state, an OFF state and a FAULT state, and wherein from the FAULT state the switching system cannot be placed in the ON until an input exceeds a preset threshold value.

2. The method of claim 1, wherein the input signal values are based on accumulated values of sampled signals.

3. The method of claim 1, wherein the sensors are capacitive sensors for detecting capacitive coupling with the object, and wherein the input signal values correspond to capacitive coupling of each of the plurality of sensors to earth, and capacitive coupling of each of the plurality of sensors to one another.

4. The method of claim 1, wherein a NOISY state is determined when noise in the input signal values is determined to be high.

5. The method of claim 1, wherein the comparison is at least partially based upon a limit between the ON state and the FAULT state.

6. The method of claim 5, wherein the limit comprises a line.

7. The method of claim 1, wherein the at least one combination of ranges of signal values corresponds to anticipated input signals received from a plurality of sensors activated by a naked human hand.

8. The method of claim 1, wherein the object is a gloved human hand.

9. A method for determining the state of a switching system comprising:
   sensing a plurality of input signals from a respective plurality of sensors activated by
   an object, at least a portion of the input signals based upon interaction of the sensors with one another;
   redundantly comparing values of the input signals to at least one combination of ranges of signal values corresponding to anticipated regions of values of the input signals derived from anticipated variations of the input signals based at least upon a type of object activating the sensors or anticipated noise at the sensors;
   determining a state of the switching system based upon the comparison; and
   generating an output signal based upon the determined state.

10. The method of claim 9, wherein the input signal values are accumulated values of sampled signals.

11. The method of claim 9, wherein the sensors are capacitive sensors detecting capacitive coupling with the object, and wherein the input signal values correspond to capacitive coupling of each of the plurality of sensors to earth, and capacitive coupling of each of the plurality of sensors to one another.

12. The method of claim 9, wherein the state is determined from one of a plurality of possible states including an ON state, an OFF state, and a FAULT state.

13. The method of claim 12, wherein from the FAULT state the switching system cannot be placed in the ON state without first implementing a reset sequence for the sensors.

14. A method for determining the state of a switching system comprising:
   measuring a plurality of input signal values from a respective plurality of sensors activated by an object;
   comparing the input signal values to at least one predetermined combination of regions of signal values to determine a state of the switching system, the states including an OFF state, an ON state and a FAULT state, and wherein from the FAULT state the switching system cannot be placed in the ON state without first implementing a reset sequence for the sensors; and
   generating an output signal corresponding to the state.

15. The method of claim 14, wherein the reset sequence includes monitoring the input signal values until the values indicate that the sensors are no longer activated.

16. The method of claim 14, wherein the sensors are capacitive sensors, and wherein the input signal values correspond to capacitive coupling of each of the plurality of sensors to earth, and capacitive coupling of each of the plurality of sensors to one another.

17. The method of claim 14, wherein comparing includes comparing the capacitive coupling of each sensor to earth, and the capacitive coupling of each sensor to one another with a combined threshold.

18. The method of claim 17 wherein the combined threshold is derived from anticipated variations of the input signals based at least upon a type of object activating the sensors or anticipated noise at the sensors.

19. A method for determining the state of a switching system comprising:
   measuring a plurality of input signal values from a respective plurality of capacitive sensors activated by an object, the input signal values corresponding to capacitive coupling of each of the plurality of sensors to earth, and capacitive coupling of each of the plurality of sensors to one another through the object;
   comparing the capacitive coupling of each sensor to earth, and the capacitive coupling of each sensor to one another with a combined threshold to at least one predetermined combination of regions of signal values to determine a state of the switching system, the states including an OFF state, an ON state and a FAULT state; and
   generating an output signal corresponding to the state.

20. A system for determining the state of a switching system comprising:
   a first and second capacitive sensors for detecting capacitive coupling with earth due to the presence of an object, and with one another;
   a sampling circuit for sampling input signals from the first and second capacitive sensors and for generating input signal values based thereon; and
   a processing circuit for comparing the input signal values with anticipated regions of input signal values to determine a state of the switching system, the regions being derived from anticipated variations of the input signals based at least upon a type of object activating the sensors or anticipated noise at the sensors.

21. The system of claim 19, wherein the sampling circuit is configured to accumulate sampled signals to generate the input signal values.

22. A system for determining the state of a switching system comprising:
- two sensors for generating signals that vary with the presence of an object;
- a sampling circuit for sampling the signals from the two sensors and for generating signal values based thereon, the signal values corresponding to capacitive coupling of each of the plurality of sensors to earth, and capacitive coupling of each of the plurality of sensors to one another through the object; and
- a processing circuit for comparing the signal values with anticipated regions of the signal values to determine a state of the switching system, the processing circuit being configured to compare the capacitive coupling of each sensor to earth, and the capacitive coupling of each sensor to one another with a combined threshold to at least one predetermined combination of regions of signal values to determine the state of the switching system, the states including an OFF state, an ON state and a FAULT state.

23. The system of claim 21, wherein the processing circuit is configured to generate an output signal that corresponds to the state of the switching system.

24. The system of claim 21, wherein the combined threshold is derived from anticipated variations of the input signals based at least upon a type of object activating the sensors or anticipated noise at the sensors.

25. The system of claim 21, wherein from the FAULT state the switching system cannot be placed in the ON state without first implementing a reset sequence for the sensors.

26. A method for determining the state of a switching system comprising:
- receiving a plurality of input signal values from a respective plurality of sensors activated by an object;
- comparing the input signal values to at least one region of signal values corresponding to anticipated values of the input signals derived from anticipated variations of the input signals based at least upon a type of object activating the sensors or anticipated noise at the sensors, wherein the input signal values are redundantly compared to the anticipated values to verify that all input signal values considered correspond to an ON state prior to determining that the system should be placed into an ON state; and
- determining a state of the switching system based upon the comparison, wherein the sensors are capacitive sensors for detecting capacitive coupling with the object, and wherein the input signal values correspond to capacitive coupling of each of the plurality of sensors to earth, and capacitive coupling of each of the plurality of sensors to one another.

* * * * *